(12) United States Patent
Koike

(10) Patent No.: US 6,548,845 B1
(45) Date of Patent: Apr. 15, 2003

(54) SEMICONDUCTOR DEVICE AND METHOD OF FABRICATING THE SAME

(75) Inventor: Osamu Koike, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 29 days.

(21) Appl. No.: 09/662,651

(22) Filed: Sep. 14, 2000

(30) Foreign Application Priority Data

Oct. 1, 1999 (JP) ............................................. 11-281590

(51) Int. Cl.[7] ......................................... H01L 21/8238
(52) U.S. Cl. ........................ 257/296; 438/253; 438/254; 438/397; 438/399; 438/238; 257/300
(58) Field of Search ................................. 438/199, 253, 438/244, 254, 387, 396, 397, 399, 255, 381, 398, 2, 3, 240, 238; 357/300, 296, 306

(56) References Cited

U.S. PATENT DOCUMENTS 6,150,689 A * 11/2000 Narui et al. ................. 257/306
6,159,786 A * 12/2000 Chiang et al. ............... 438/238
6,268,244 B1 * 7/2001 Park ............................ 438/253

* cited by examiner

*Primary Examiner*—Matthew Smith
*Assistant Examiner*—Igwe U. Anya
(74) *Attorney, Agent, or Firm*—Volentine Francos, PLLC

(57) ABSTRACT

A semiconductor device includes a semiconductor substrate, a gate electrode formed over the semiconductor substrate and a first interlevel insulating layer which is formed over the semiconductor substrate and has first and second contact holes defined by the first interlevel insulating layer. The semiconductor device also includes a first wiring pattern formed in the first contact hole and on the first interlevel insulating layer, a protection layer covering the first wiring pattern and a second interlevel insulating layer which is formed over the first interlevel insulating layer and has a third contact hole defined by the second interlevel insulating layer. The semiconductor device further includes the third contact hole being located on the second contact hole and a second wiring pattern formed in the second and third contact holes and on the second interlevel insulating layer.

14 Claims, 8 Drawing Sheets

SEMICONDUCTOR DEVICE AND METHOD OF FABRICATING THE SAME

BACKGROUND OF THE INVENTION

1. Field of the Invention

The present invention generally relates to a semiconductor device and a method of fabricating the same, and more particularly, to a semiconductor device having a capacitor over bit line structure and a method of fabricating thereof.

Furthermore, the present invention relates to a semiconductor device having a wiring pattern formed between two insulating films and a method of fabricating thereof.

This application is counterparts of Japanese patent applications, Serial Number 281590/1999, filed Oct. 1, the subject matter of which is incorporated herein by reference.

2. Description of the Related Art

Conventional semiconductor device and its fabricating method are explained by using an example. A DRAM (Dynamic Random Access Memory) having CMOS (Complementary Metal Oxide Semiconductor) structure is used as the example.

A DRAM that has a capacitor over bit line structure (it is called COB structure hereinafter) is known as a conventional DRAM. This structure intends to improve the degree of integration of DRAM by forming a capacitor at a layer located over a bit line.

FIG. 7 is a cross sectional view showing roughly the DRAM having the COB structure.

In FIG. 7, an active region (it is also called as an element formation region) 702 is provided in an n-well 701 formed in a silicon substrate 700. High concentration impurity regions 703 functioned as a source or a drain of a MOS transistor are formed on a surface of the active region 702 and are formed on a region adjacent to the surface. A region provided between the active regions 703 serves as a channel region 704.

A word line 706 served as a gate electrode is formed on a gate oxide film 705 which is formed over the channel region 704. A side wall spacers 707 are formed on side walls of the word lines 706. Surfaces of the gate oxide film 705, the word lines 706 and the side wall spacers 707 are covered with Non Silicate Glass (it is called hereinafter NSG) film 708.

A first Boro-Phospho Silicate Glass (it is called hereinafter BPSG) film 709 is formed on the entire surface of the NSG film 708. A bit line 710 is formed on the first BPSG film 709. The bit line 710 is composed of a polycrystalline silicon layer 710a and a tungsten silicide (WSix) layer 710b. The shape of the bit line 710 as illustrated in FIG. 7 is obtained by using a conventional photo-lithography technology. The bit line 710 is connected to the high concentration impurity region 703 by way of a polycrystalline silicon 712 formed in a contact hole 711.

A second BPSG film 713 is formed over an entire surface of the first BPSG film 709. A capacitor 714 is formed on the second BPSG film 713. The capacitor 714 is composed of an electrode layer 714a made of polycrystalline silicon, an insulating thin film 714b made of silicon nitride film and an electrode layer 714c made of polycrystalline silicon. The electrode layer 714a is formed on the second BPSG film 713. The insulating thin film 714b is deposited over the electrode layer 714a so as to cover a surface of the electrode layer 714a and a surface of the second BPSG film 713. The electrode layer 714c is deposited on the insulating thin film 714b after performing a healing oxidation process to remove defect of the insulating thin film 714b. The capacitor 714 is connected to the high concentration impurity region 703 by way of the polycrystalline silicon 715 formed in a contact hole 712. In addition, a protection film or the like is formed on a surface of the electrode layer 714c. (not illustrated in FIG. 7)

By adopting such structure (namely, COB structure), it is possible to enlarge area of the capacitor 714 without reducing the degree of integration of DRAM. Therefore, such structure is effective when increasing capacity of the capacitor 714.

In the case that a structure that has the capacitor 714 provided on the first BPSG film 709 and the bit line 710 provided on the second BPSG film 713, a diameter of the contact hole 711 must be set small in order to enlarge the area of the capacitor 714. However, minimizing the diameter has limitations. Therefore, the structure prevents the improvement of the degree of the integration.

On the other hand, in the COB structure as illustrated in FIG. 7, the contact hole 711 does not serve as an obstacle when increasing the area of the capacitor 714. Thus, in the COB structure, it is possible to enlarge the area of the capacitor 714 without reducing the degree of the integration.

However, it is difficult to obtain the capacitor 714 having a large capacitance by increasing the area of the capacitor 714. For this reason, in order to obtain the capacitor 714 having the larger capacitance, reducing thickness of the insulating thin film 714b is needed.

However, if the thickness of the insulating thin film 714b is made thin, the bit line 710 becomes being easy to oxidize in a fabrication process of DRAM. The reason is explained as follows.

As mentioned above, the healing oxidation process is carried out to remove the defect of the silicon nitride film in the fabrication process of DRAM. When the silicon nitride film is very thick, the silicon nitride film serves as a mask. Thus, an oxidation nucleus, which occurs at the healing oxidation process, does not reach to the bit line 710 easily. In this case, the bit line 710 is prevented from being oxidized.

On the other hand, when the silicon nitride film is very thin, the silicon nitride does not serve as the mask well. Thus, the oxidation nucleus reaches to the bit line 710 easily. As a result, the bit line 710 is oxidized easily.

In the conventional DRAM, as enhancing the high integration, the bit line 710 becomes being easy to oxidize. The oxidation of the bit line 710 causes a decrease of yield and reliability of DRAM.

Such this problem is not restricted to DRAM. This problem occurs at a semiconductor device which has a wiring pattern provided between two insulating layers.

Consequently, there has been a need for an improved semiconductor device that may prevent such wiring pattern from being oxidized.

SUMMARY OF THE INVENTION

It is an object of the present invention is to provide a semiconductor device that may prevent a wiring, which is provided between two insulating layers, from being oxidized.

It is another object of the present invention is to provide a semiconductor device that may prevent a bit line shift.

According to one aspect of the present invention, for achieving one or more of the above objects, there is provided a semiconductor device which includes a semiconductor substrate, a gate electrode formed over the semiconductor substrate and a first interlevel insulating layer which is formed over the semiconductor substrate and has first and second contact holes defined by the first interlevel insulating layer. The semiconductor device also includes a first wiring pattern formed in the first contact hole and on the first interlevel insulating layer, a protection layer covering the first wiring pattern and a second interlevel insulating layer which is formed over the first interlevel insulating layer and has a third contact hole defined by the second interlevel insulating layer. The semiconductor device further includes the third contact hole being located on the second contact hole and a second wiring pattern formed in the second and third contact holes and on the second interlevel insulating layer.

The above and further objects and novel features of the invention will more fully appear from the following detailed description, appended claims and the accompanying drawings.

DETAILED DESCRIPTION OF THE PREFERRED EMBODIMENTS

First Preferred Embodiment

Figure 1:
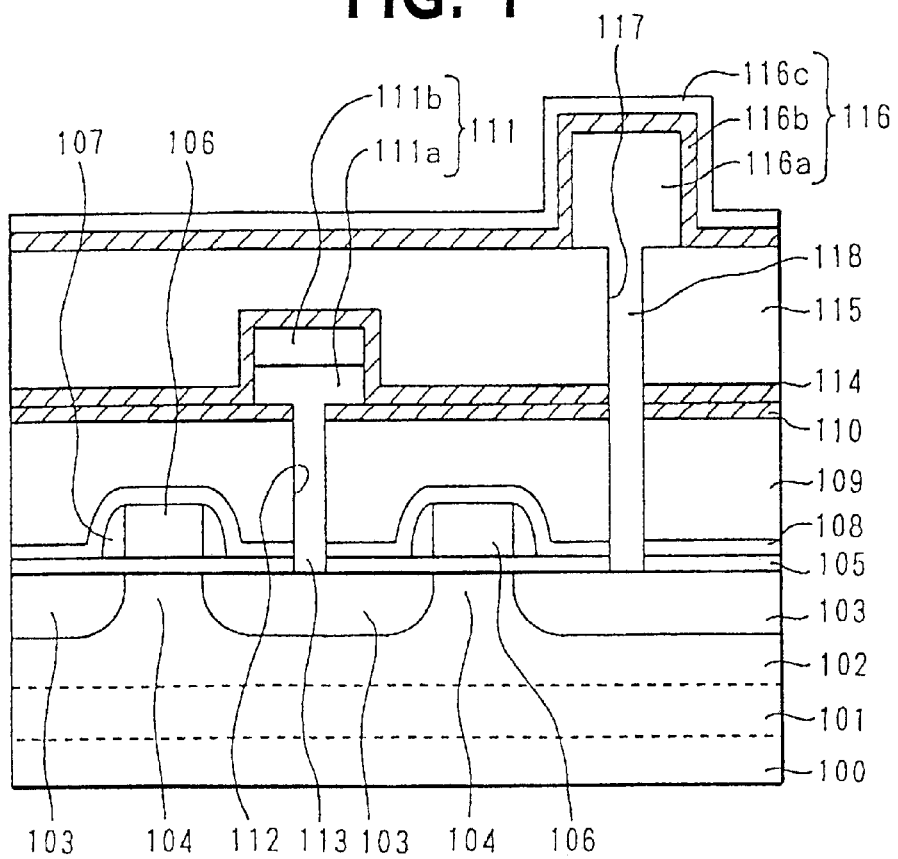
FIG. 1 is a cross sectional view showing roughly a semiconductor device according to a first preferred embodiment of the present invention.
Figure 2A:
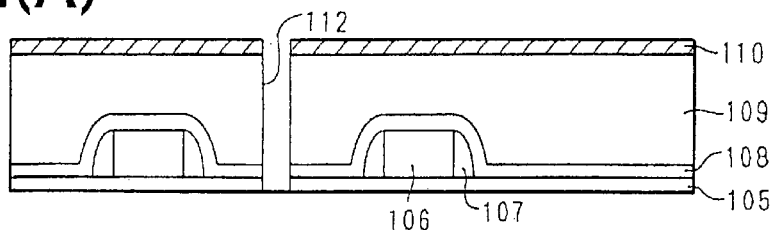
FIG. 2(A) through FIG. 2(D) are process charts showing a fabrication process of a semiconductor device according to a first preferred embodiment of the present invention.
Figure 2B:
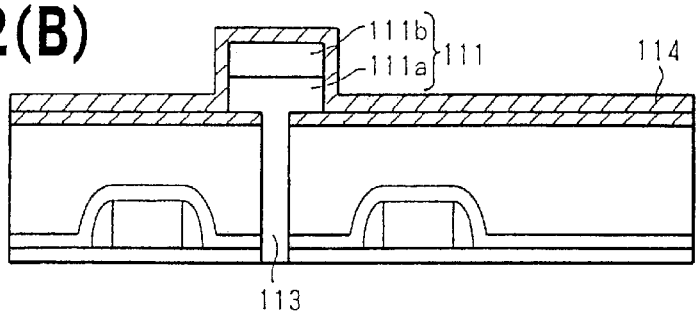
Figure 2C:
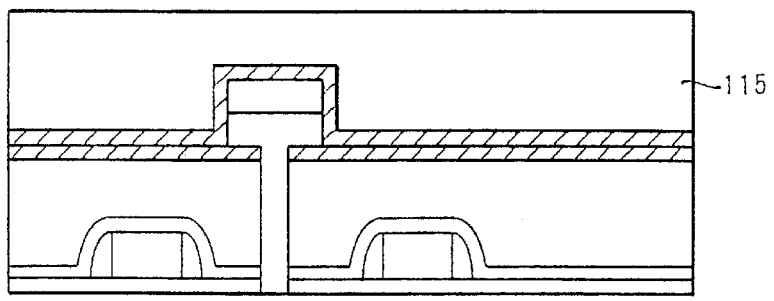
Figure 2D:
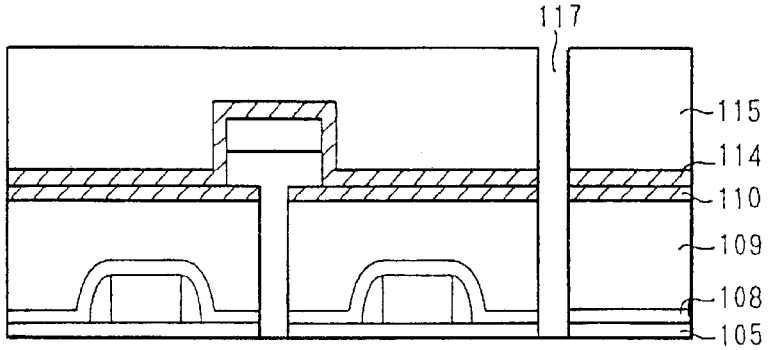

A semiconductor device according to preferred embodiments of the present invention will be explained hereinafter with reference to figures. In order to simplify explanation, like elements are given like or corresponding reference numerals through this specification and figures. Dual explanations of the same elements are avoided.

FIG. 1 is a cross sectional view showing roughly a semiconductor device according to a first preferred embodiment of the present invention. A DRAM having a COB structure is explained as an example of the semiconductor device.

In FIG. 1, an active region (it is also called as an element formation region) 102 is provided in an n-well 101 formed in a silicon substrate 100. High concentration impurity regions 103 functioned as a source or a drain of a MOS transistor are formed on a surface of the active region 102 and are formed on a region adjacent to the surface. A region provided between the active regions 103 serves as a channel region 104.

A word line 106 served as a gate electrode is formed on a gate oxide film 105 which is formed over the channel region 104. Side wall spacers 107 are formed on side walls of the word lines 106. Surfaces of the gate oxide film 105, the word lines 106 and the side wall spacers 107 are covered with Non Silicate Glass (it is called hereinafter NSG) film 108.

A first Boro-Phospho Silicate Glass (it is called hereinafter BPSG) film 109 is formed on the entire surface of the NSG film 108. The BPSG film 109 serves as an interlevel insulating layer.

A first silicon nitride film 110 is formed on the first BPSG film 109.

A bit line 111 is formed over the first silicon nitride film 110. The bit line 111 is composed of a polycrystalline silicon layer 111a formed over the first silicon nitride film 110 and a tungsten silicide (WSix) layer 111b formed over the polycrystalline layer 111a.

The bit line 111 is connected to the high concentration impurity region 103 by way of a polycrystalline silicon 113 formed in a contact hole 112.

A second silicon nitride layer 114 is formed on the first silicon nitride layer 110 and an upper and side surfaces of the bit line 111. A second BPSG film 115 is formed over an entire surface of the second silicon nitride film 114. The BPSG film 115 serves as an interlevel insulating layer.

A capacitor 116 is formed on the second BPSG film 115. The capacitor 116 is composed of an electrode layer 116a made of polycrystalline silicon, an insulating thin film 116b made of silicon nitride film and an electrode layer 116c made of polycrystalline silicon. The electrode layer 116a is formed on the second BPSG film 115. The insulating thin film 116b is deposited over the electrode layer 116a so as to cover a surface of the electrode layer 116a and a surface of the second BPSG film 115.

The capacitor 116 is connected to the high concentration impurity region 103 by way of the polycrystalline silicon 118 formed in a contact hole 117. In addition, a protection film or the like is formed on a surface of the electrode layer 116c, but not illustrated in FIG. 7.

Next, a fabrication process of the DRAM as shown in FIG. 1 is explained hereinafter with reference to FIG. 2(A) through FIG. 2(D)

Step (1)

First, the n-well region 101 is formed in the silicon substrate 100 by using well known ion implantation technique. An element isolation films (not illustrated) are formed in the n-well region 101 and a p-type region.

Next, the high concentration impurity region 103 is formed in the active region 102, which is defined by the element isolation films, by using well known photolithography and the ion implantation technique.

Step (2)

Next, the gate oxide film 105 is formed on the entire surface of the silicon substrate 101 by using a thermal oxidation method.

After that, a polycrystalline silicon film is formed on the entire surface of the gate oxide film 105 by using a CVD method. The polycrystalline silicon film is patterned by well known the photolithography and an etching technique and thus the word line 106 served as the gate electrode.

Step (3)

Next, a NSG film is formed over the entire surface of the silicon substrate 101. Thereafter, the NSG film is subjected to an etching process and thus the side wall spacers 107 are formed on the side walls of the word line 106.

Furthermore, the NSG film 108 is formed over the gate oxide film 105, the word line 6 and the side wall spacer 107 by using the CVD method.

Next, the first BPSG film 109 is formed on the entire surface of the NSG film 108 by using the CVD method. Then, a heat treatment is carried out to the first BPSG film 109 to planarize the surface of the BPSG film 109.

Step (4)

Next, the first silicon nitride film 110 is formed on the entire surface of the first BPSG film 109 by using the CVD method. Then, the contact hole 112 is formed at a location where the bit line 111 is to be formed at step (5) by using the well known photolithography and the etching technique. The contact hole 112 penetrates the gate oxide film 105, the NSG film 108, the first BPSG film 109 and the first silicon nitride film 110. (refer to the FIG. 2(A))

Step (5)

The polycrystalline silicon film is deposited on the first silicon nitride film 110 and the contact hole 112 by using the CVD method. Thereby the polycrystalline silicon film is formed on the first silicon nitride film 110. In addition, the polycrystalline silicon film is connected to the high concentration impurity region 103 by way of the polycrystalline silicon 113 formed in the contact hole 112.

After that, the tungsten silicide film (WSix) is formed on the polycrystalline silicon film by using the CVD method. Then, the polycrystalline silicon film and the tungsten silicide film are patterned by using the well known photolithography and the etching technique and thus the bit line 111 which is composed of the polycrystalline layer 111a and the tungsten silicide layer 111b is obtained.

Step (6)

The second silicon nitride film 114 is formed on the entire surface so as to cover the first silicon nitride film 110 and the bit line 111 by using the CVD method. (refer to FIG. 2(B))

Next, the second BPSG film 115 is formed on the second silicon nitride film 114 by using the CVD method. (refer to FIG. 2(C)) Then, the second BPSG film 115 is subjected to the heat treatment to planalize the surface of the second BPSG film 115.

After that, the contact hole 117 is formed at a location where the capacitor is to be formed at step (7). The contact hole 117 penetrates the gate oxide film 105, the NSG film 108, the first BPSG film 109, the second BPSG film 115, the first silicon nitride film 110 and the second silicon nitride film 114. (refer to FIG. D))

Step (7)

The polycrystalline silicon is formed on the second BPSG film 115 and the contact hole 117. The electrode layer 116a is obtained by using well known photolithography and the etching technique. The electrode layer 116a is connected to the high concentration impurity region 103 by way of the polycrystalline silicon 118 formed in the contact hole 117.

Step (8)

A thin insulating film (i.e., the silicon nitride film) 116b is deposited on the electrode layer 116a and the second BPSG film 115 by using the CVD method. Then, the healing oxidization is performed to remove a defect of the thin insulating film 116b. At this time, an oxidation nucleus which has occurred by the healing oxidization enters into the BPSG film 109 and 115. However, since the bit line 111 is covered with the first silicon nitride film 110 and the second silicon nitride film 114, the oxidation nucleus does not reach to the bit line 111. Therefore, the bit line 111 is prevented from being oxidized.

Step (9)

Next, an electrode layer (i.e., the polycrystalline film) 116c is deposited on the entire surface of the thin insulating film 116b and thus the structure as illustrated in FIG. 1 is obtained. Then, a protection film is formed on the electrode layer 116c and thus the DRAM is completed.

As explained above, since the bit line 111 is covered with the first silicon nitride film 110 and the second silicon nitride film 114, the bit line 111 can be prevented from being oxidized.

Second Preferred Embodiment

A semiconductor device according to a second preferred embodiment of the present invention will be explained hereinafter with reference to FIG. 3 and FIG. 4.

Figure 3:
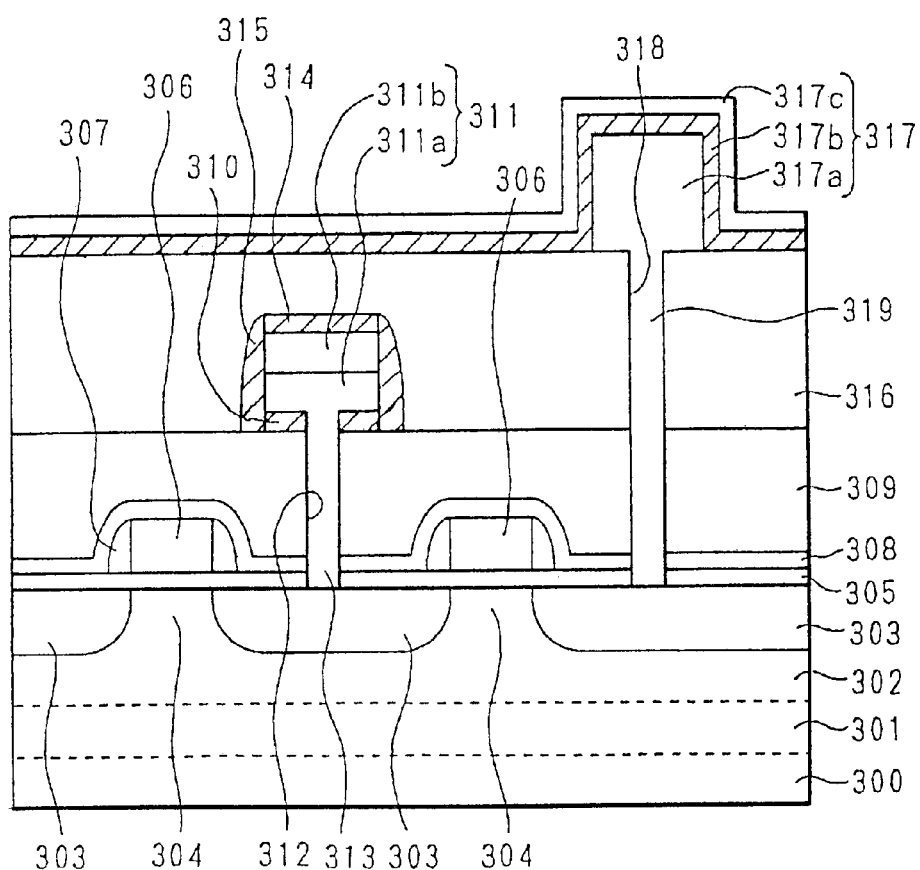
FIG. 3 is a cross sectional view showing roughly a semiconductor device according to a second preferred embodiment of the present invention.
Figure 4A:
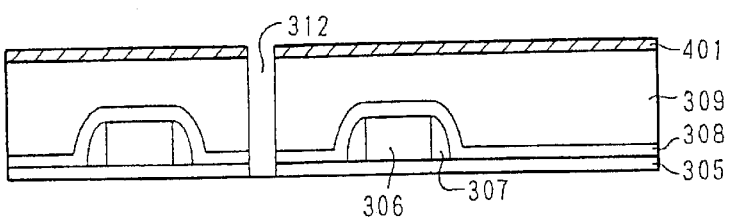
FIG. 4(A) through FIG. 4(E) are process charts showing a fabrication process of a semiconductor device according to a second preferred embodiment of the present invention.
Figure 4B:
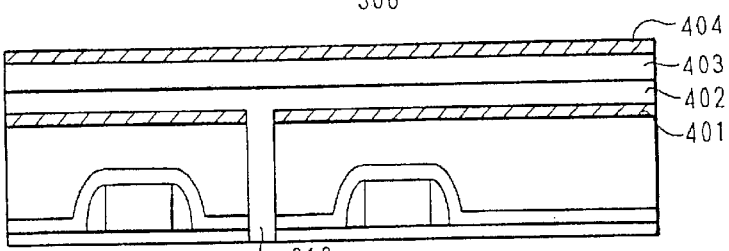
Figure 4C:
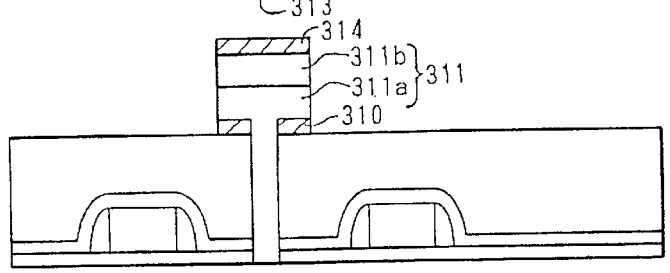
Figure 4D:
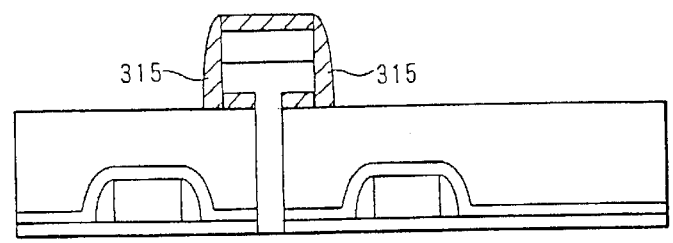
Figure 4E:
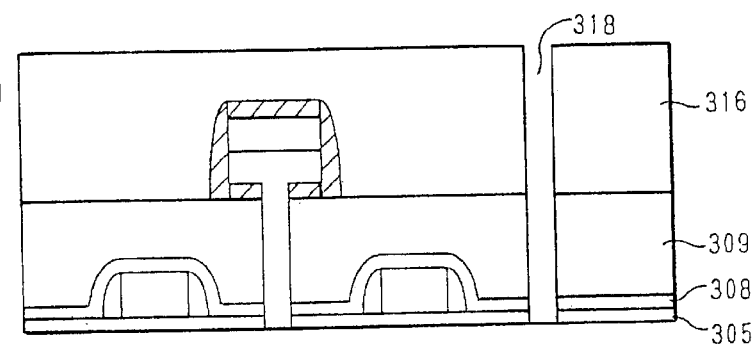
Figure 5A:
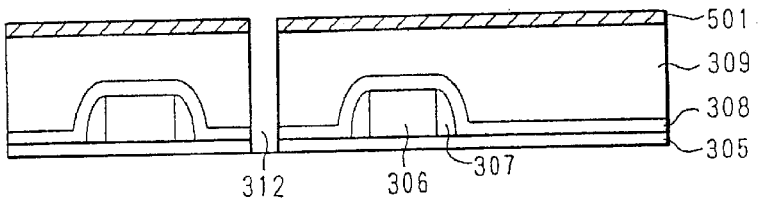
FIG. 5(A) through FIG. 5(E) are process charts showing a fabrication process of a semiconductor device according to a third preferred embodiment of the present invention.
Figure 5B:
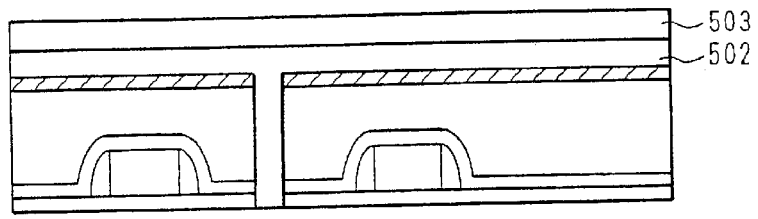
Figure 5C:
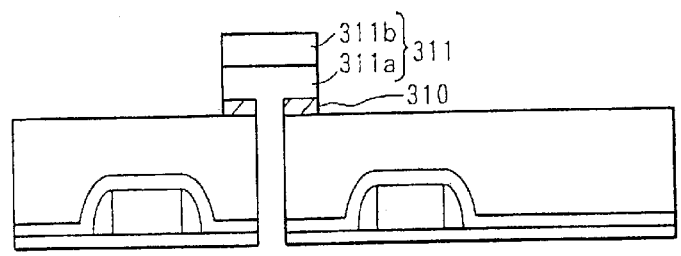
Figure 5D:
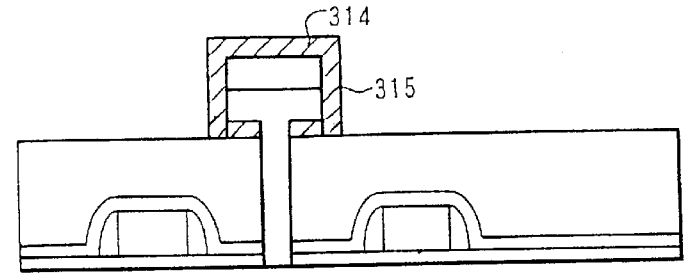
Figure 5E:
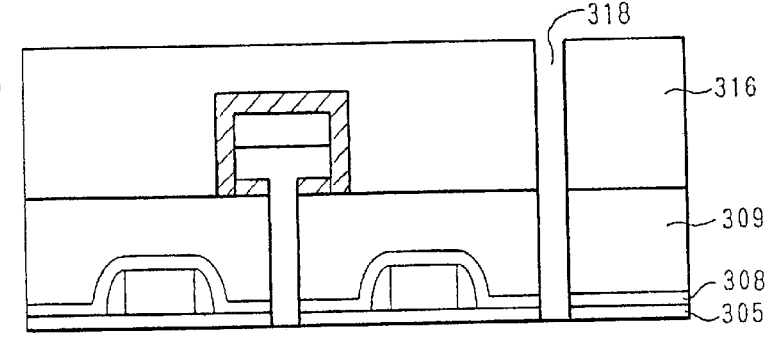

FIG. 3 is a cross sectional view showing roughly a semiconductor device according to the second preferred embodiment of the present invention. A DRAM having the COB structure is explained as an example of the semiconductor device.

The difference between the second preferred embodiment and the first preferred embodiment resides in that the silicon nitride film is not formed around the contact hole which extends from the capacitor to the high concentration impurity region.

In FIG. 3, an active region (it is also called as an element formation region) 302 is provided in an n-well 301 formed in a silicon substrate 300. High concentration impurity regions 303 functioned as a source or a drain of a MOS transistor are formed on a surface of the active region 302 and are formed on a region adjacent to the surface. A region provided between the active regions 303 serves as a channel region 304.

A word line 306 served as a gate electrode is formed on a gate oxide film 305 which is formed over the channel region 304. A side wall spacers 307 are formed on side walls of the word lines 306. Surfaces of the gate oxide film 305, the word lines 306 and the side wall spacers 307 are covered with Non Silicate Glass (it is called hereinafter NSG) film 308.

A first Boro-Phospho Silicate Glass (it is called hereinafter BPSG) film 309 is formed on the entire surface of the NSG film 308. The BPSG film 309 serves as an interlevel insulating layer.

A bit line 311 is formed on a bottom surface protection film 310 which is formed on the first BPSG film 309.

The bit line 311 is composed of a polycrystalline silicon layer 311a and a tungsten silicide (WSix) layer 311b formed on the polycrystalline layer 311a.

The bit line 311 is connected to the high concentration impurity region 303 by way of a polycrystalline silicon 313 formed in a contact hole 312.

A top surface protection film 314 is formed on the top surface of the bit line 311. A side surface protection film 315 is formed on the side surface of the bit line 311. A second BPSG 316 is formed on the first silicon nitride layer 309 and surfaces of the protection films 314 and 315. The BPSG film 316 serves as the interlevel insulating layer.

A capacitor 317 is formed on the second BPSG film 316. The capacitor 316 is composed of an electrode layer 317a made of polycrystalline silicon, an insulating thin film 317b made of silicon nitride film and an electrode layer 317c made of polycrystalline silicon. The electrode layer 317a is formed on the second BPSG film 316. The insulating thin film 317b is deposited over the electrode layer 317a so as to cover a surface of the electrode layer 317a and a surface of the second BPSG film 316.

The capacitor 317 is connected to the high concentration impurity region 303 by way of the polycrystalline silicon 319 formed in a contact hole 318. In addition, a protection film or the like is formed on a surface of the electrode layer 317c, but not illustrated in FIG. 3.

Next, a fabrication process of the DRAM as shown in FIG. 3 is explained hereinafter with reference to FIG. 4(A) through FIG. 4(E)

Step (1)

First, the n-well region 301 is formed in the silicon substrate 300 by using well known ion implantation technique. An element isolation films (not illustrated) are formed in the n-well region 301 and a p-type region.

Next, the high concentration impurity region 303 is formed in the active region 302 which is defined by the element isolation films.

Step (2)

Next, the gate oxide film 305 is formed on the entire surface of the silicon substrate 301. Then a word line 305 and side wall spacers 307 are formed over the gate oxide film 305.

Next, a NSG film 308 and a first BPSG film 309 are formed over the entire surface of the silicon substrate 300.

Thereafter, the first BPSG film 309 is subjected to a heat treatment to planarize a surface of the first BPSG film 309.

Step (3)

Next, the first silicon nitride film 401 is formed on the entire surface of the first BPSG film 309. Then, the contact hole 312 is formed at a location where the bit line 311 is to be formed. The contact hole 311 penetrates the gate oxide film 305, the NSG film 308, the first BPSG film 309 and the first silicon nitride film 401. (refer to the FIG. 4(A))

Step (4)

A polycrystalline silicon film is deposited on the first silicon nitride film 401 and the contact hole 312 by using the CVD method. Thereby the polycrystalline silicon film 402 is formed on the first silicon nitride film 401. In addition, the polycrystalline silicon film is connected to the high concentration impurity region 303 by way of the polycrystalline silicon 313 formed in the contact hole 312.

After that, the tungsten silicide film (WSix) 403 and the second silicon nitride film 404 are sequentially formed on the polycrystalline silicon film 402 by using the CVD method. (refer to FIG. 4(B))

Furthermore, the bottom surface protection film 310, the bit line 311 and the upper surface protection film 314 are obtained by patterning these films 401 through 404. (refer to FIG. 4(C))

Then, a silicon nitride film is formed on the entire surface.

After that, side wall spacers served as the side surface protection film 315 are formed by patterning the silicon nitride film. (refer to FIG. 4(D))

Step (5)

Next, the second BPSG film 316 is formed on the first BPSG film 309 and the protection films 314 and 315 by using the CVD method. Then, the second BPSG film 316 is subjected to the heat treatment to planalize the surface of the second BPSG film 316.

In this structure at this step, no silicon nitride film served as a protection film is formed on the BPSG film 309 and the BPSG film 316. Therefore, a situation that the bit line 311 is not formed at a predetermined position does not occur. The reason is explained later.

After that, the contact hole 318 is formed at a position where the capacitor is to be formed at step (6). The contact hole 318 penetrates the gate oxide film 305, the NSG film 308, the first BPSG film 309 and the second BPSG film 316. (refer to FIG. 4(E))

Since a step for etching the silicon nitride film is not needed when the contact hole 318 is formed, there is no possibility that an etching stop occurs.

Step (6)

The polycrystalline silicon is formed on the second BPSG film 316 and the contact hole 318. The electrode layer 317a is obtained by using well known photolithography and the etching technique. The electrode layer 317a is connected to the high concentration impurity region 303 by way of the polycrystalline silicon 319 formed in the contact hole 318.

Step (7)

The thin insulating film (i.e., the silicon nitride film) 317b is deposited on the electrode layer 317a and the second BPSG film 316 by using the CVD method. Then, the healing oxidization is performed to remove a defect of the thin insulating film 317b. At this time, an oxidation nucleus which has occurred by the healing oxidization enters into the BPSG film 309 and 316. However, since the bit line 311 is covered with the protection films 310, 314 and 315, the oxidation nucleus does not reach to the bit line 311. Therefore, the bit line 311 is prevented from being oxidized.

Step (8)

Next, an electrode layer (i.e., the polycrystalline film) 317c is deposited on the entire surface of the thin insulating film 316b and thus the structure as illustrated in FIG. 3 is obtained. Then, a protection film is formed on the electrode layer 317c and thus the DRAM is completed.

As explained above, in this preferred embodiment, the silicon nitride film is not formed at a region where the contact hole 318 is provided.

An etching rate of the silicon nitride film to an usual etching liquid is smaller than that of the BPSG film.

For this reason, when a diameter of the contact hole 318 is relatively small, the etching stop easily occurs at the silicon nitride film provided between the first BPSG film and the second BPSG film. (refer to FIG. 1)

Therefore, when the contact hole 318 has a relatively small diameter, the structure having no silicon nitride film at a region where the contact hole is formed is preferable.

On the other hand, when the contact hole 318 has a relatively large diameter, the etching stop does not occur easily. In this case, adopting the structure of the first preferred embodiment is preferable. Because, the first preferred embodiment has less fabrication process steps than the second preferred embodiment.

Moreover, as mentioned above, the silicon nitride film is not formed on the BPSG film 309 and 316. Therefore, a case that the bit line 311 is not provided at the predetermined position (it is called as a bit line shift) can be prevented even if the heat treatment is carried out to the BPSG films 309 and 316.

Figure 8:
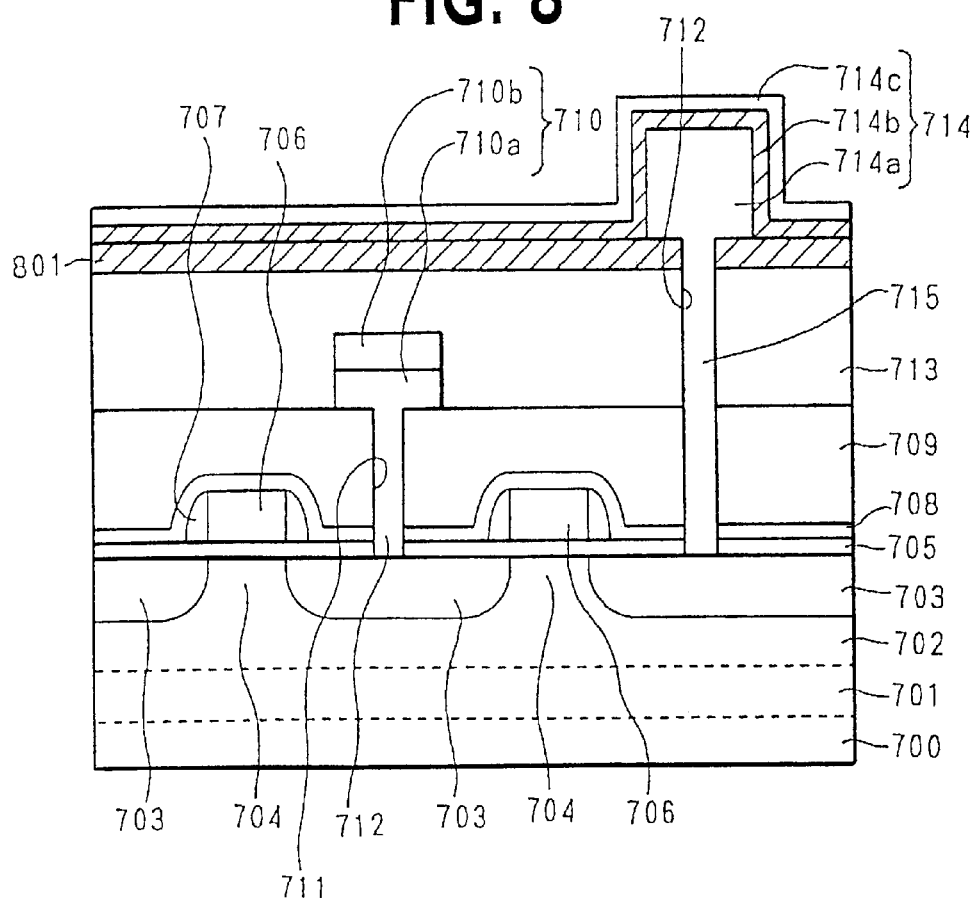
FIG. 8 is a cross sectional view explaining a bit line shift.

FIG. 8 is a cross sectional view explaining the bit line shift.

Figure 7:
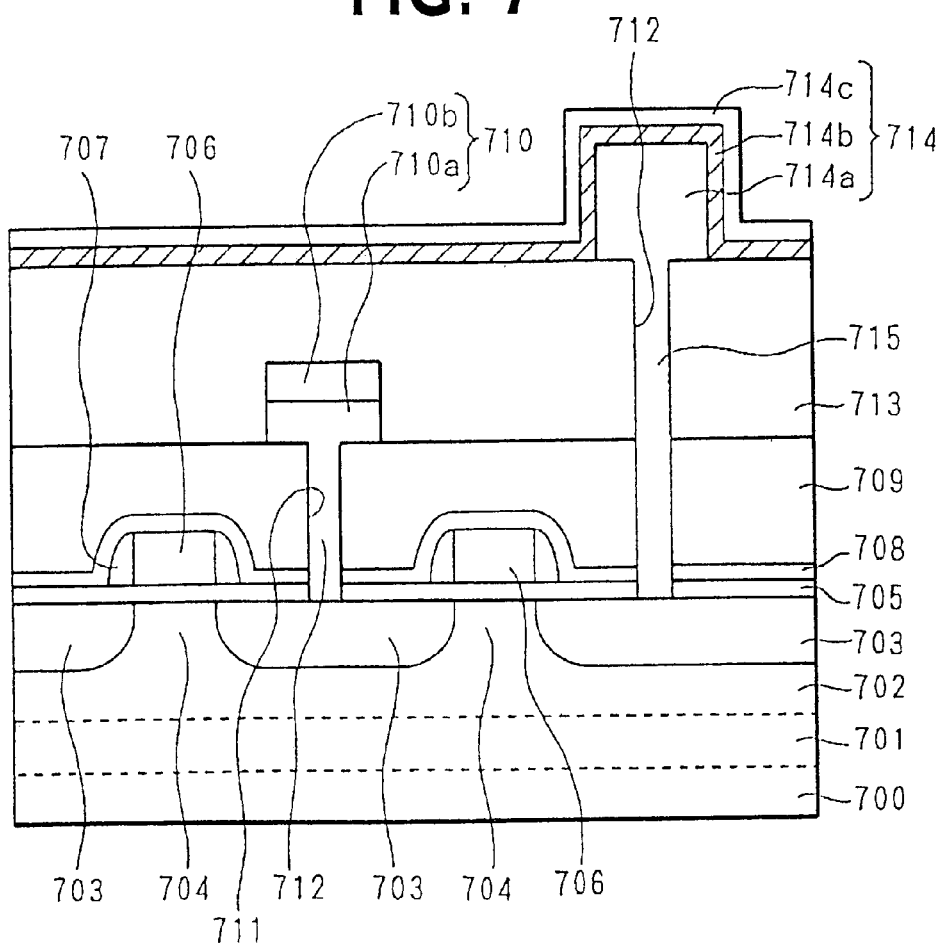
FIG. 7 is a cross sectional view showing roughly a conventional semiconductor device.

In order to simplify explanation, reference numerals of elements in FIG. 8 are given corresponding reference numerals in FIG. 7.

In FIG. 8, a silicon nitride film 801 having a relatively large thickness is formed on the second BPSG film 713 in order to prevent entering the oxidation nucleus at the healing oxidation step. In this structure, Even if the BPSG film 713 is subjected to the heat treatment after the silicon nitride film 801 is formed, the silicon nitride film 801 is shrunken due to the heat. Therefore, the bit line 710 is shifted in a horizontal direction.

There is a possibility that such this bit line shift occurs in the first preferred embodiment. Because, the silicon nitride film is formed on the first BPSG film. Such this bit line shift also cause a decrease of yield and reliability of DRAM.

On the other hand, in the second preferred embodiment of the present invention, the silicon nitride film is not formed on the BPSG films 309 and 316. That is, the silicon nitride film covers only the surface of the bit line 311.

Consequently, the bit line shift can be prevented at the heat treatment step for the BPSG films.

In addition, since the bit line 311 is covered by the protection film 310, 314 and 315, the point that oxidization of the bit line 311 can be prevented is the same as the first preferred embodiment.

Third Preferred Embodiment

A semiconductor device according to a third preferred embodiment of the present invention will be explained hereinafter with reference to FIG. 5 and FIG. 6.

A DRAM having the COB structure is explained as an example of the semiconductor device.

The difference between the third preferred embodiment and the second preferred embodiment resides in that a protection film for protecting the upper and the side surfaces of the bit line is composed of one layer.

The final structure of DRAM of the third preferred embodiment is the substantially the same as the second preferred embodiment. Therefore, a cross sectional view corresponding to FIG. 3 is omitted.

A fabrication process of the DRAM of the third preferred embodiment is explained hereinafter with reference to FIG. 5(A) through FIG. 5(E)

Step (1)

First, the n-well region 301 and element isolation films are formed in the silicon substrate 300.

Next, the high concentration impurity region 303 is formed in the active region 302 which is defined by the element isolation films.

Step (2)

Next, the gate oxide film 305 is formed on the entire surface of the silicon substrate 301. Then the word line 305 and side wall spacers 307 are formed over the gate oxide film 305.

Next, the NSG film 308 and the first BPSG film 309 are formed over the entire surface of the silicon substrate 300.

Thereafter, the first BPSG film 309 is subjected to a heat treatment to planarize a surface of the first BPSG film 309.

Next, the first silicon nitride film 501 is formed on the entire surface of the first BPSG film 309. Then, the contact hole 312 is formed at a location where the bit line 311 is to be formed. The contact hole 311 penetrates the gate oxide film 305, the NSG film 308, the first BPSG film 309 and the first silicon nitride film 501. (refer to the FIG. 5(A))

Step (3)

The polycrystalline silicon film is deposited on the first silicon nitride film 501 and the contact hole 312. Thereby the polycrystalline silicon film 502 is formed on the first silicon nitride film 501 and the contact hole 312. Thereby, the polycrystalline silicon film is connected to the high concentration impurity region 303 by way of the polycrystalline silicon 313 formed in the contact hole 312.

After that, the tungsten silicide film (WSix) 503 is formed on the polycrystalline silicon film 502. (refer to FIG. 5(13))

Step (4)

The bottom surface protection film 310 and the bit line 311 are obtained by patterning these films 501 through 503. (refer to FIG. 5(C))

Step (5)

After that, an upper surface protection part 314 and a side surface protection part 315 are simultaneously formed by using Low Pressure Chemical Vapor Deposition (LPCVD) method. (refer to FIG. 5(D))

Figure 6:
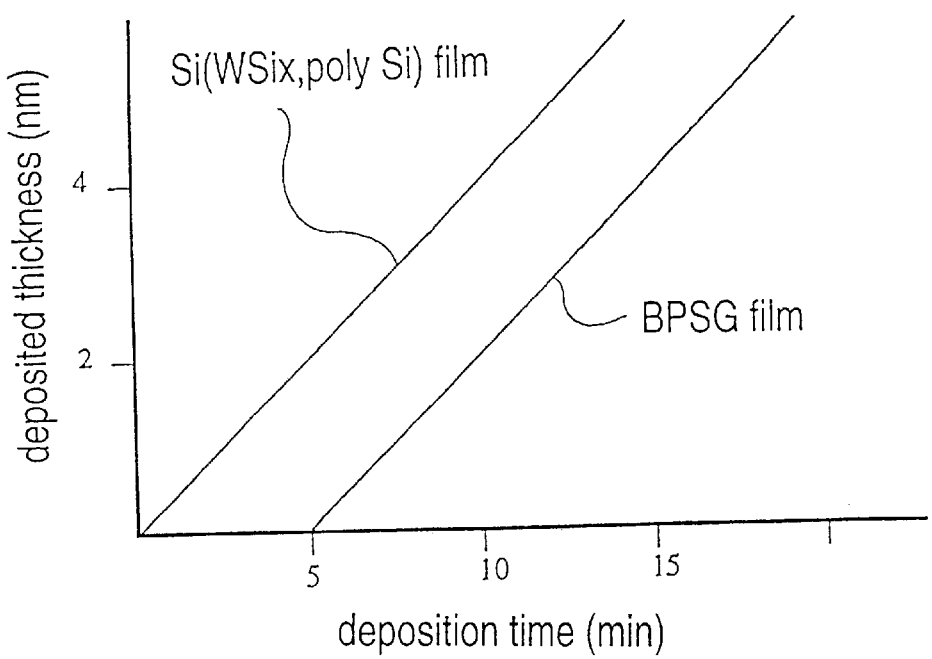
FIG. 6 is a graph showing a relationship between deposition time and deposited thickness when a silicon nitride film is deposited on a thin film.

FIG. 6 is a graph showing a relationship between deposition time and deposited thickness when a silicon nitride film is deposited on a thin film.

As shown in FIG. 6, there is a time difference (i.e., 5 minutes) in the deposition time between a case 1 and a case 2. The time difference is called as incubation time. The case 1 means that the thin film is tungsten silicide film or polycrystalline silicon film. The case 2 means that the thin film is BPSG film.

The thickness of the silicon nitride film, which is formed on the polycrystalline silicon and the tungsten silicide film of the bit line 311, is about 2 nm at a beginning of formation of the silicon nitride film on the BPSG film 309.

Therefore, the silicon nitride film can be formed only on the polycrystalline silicon film 311a and the tungsten silicide film 311b by stopping a film deposition device before beginning of formation of the silicon nitride film. Thereby, the upper surface protection part 314 and the side surface protection part 315 are formed simultaneously on the bit line 311. As a result, fabrication process steps can be reduced.

Step (6)

Next, the second BPSG film 316 is formed on the first BPSG film 309 and the protection parts 314 and 315. Then, the second BPSG film 316 is subjected to the heat treatment to planalize the surface of the second BPSG film 316.

In this structure at this step, no silicon nitride film served as a protection film is formed on the BPSG film 309 and the BPSG film 316. (refer to FIG. 8) Therefore, the bit line shift explained above does not occur.

After that, the contact hole 318 is formed at a position where the capacitor is to be formed. The contact hole 318 penetrates the gate oxide film 305, the NSG film 308, the first BPSG film 309 and the second BPSG film 316. (refer to FIG. 5(E)).

Since a step for etching the silicon nitride film is not needed when the contact hole 318 is formed, there is no possibility that an etching stop occurs.

Step (7)

The polycrystalline silicon is formed on the second BPSG film 316 and the contact hole 318. The electrode layer 317a is obtained by using well known photolithography and the etching technique. The electrode layer 317a is connected to the high concentration impurity region 303 by way of the polycrystalline silicon 319 formed in the contact hole 318.

The thin insulating film (i.e., the silicon nitride film) 317b is deposited on the electrode layer 317a and the second BPSG film 316 by using the CVD method. Then, the healing oxidization is performed to remove a defect of the thin insulating film 317b. In this time, a oxidation nucleus which is occurred by the healing oxidization enters into the BPSG film 309 and 316. However, since the bit line 311 is covered with the protection parts 310, 314 and 315, the oxidation nucleus is not reached to the bit line 311. Therefore, the bit line 311 is prevented from being oxidized.

Step (8)

Next, an electrode layer (i.e., the polycrystalline film) 317c is deposited on the entire surface of the thin insulating film 317b and thus the structure as illustrated in FIG. 3 is obtained. Then, a protection film is formed on the electrode layer 317c and thus the DRAM is completed.

In this preferred embodiment, since the protection film for protecting the bit line can be formed simultaneously, fabrication process steps can be reduced. Thus, this preferred embodiment is cost effective.

The point that the bit line 311 can be prevented from being oxidized is the same as the second preferred embodiment. The point that occurrence of the etching stop can be prevented is the same as the second preferred embodiment. The point that the bit line shift can be prevented is the same as the second preferred embodiment.

The DRAM having the COB structure is explained as examples in these preferred embodiments. However, the present invention is not limited to such structure. The present invention is applicable to other semiconductor integrated circuits.

While the preferred form of the present invention has been described, it is to be understood that modifications will be apparent to those skilled in the art without departing from the spirit of the invention. The scope of the invention is to be determined solely by the following claims.

What is claimed is:

1. A method of fabricating a semiconductor device comprising:
    forming a gate electrode over a semiconductor substrate;
    forming a first interlevel insulating layer over the semiconductor substrate;
    forming a first protection layer over the first interlevel insulating layer;
    exposing a first portion of the semiconductor substrate by removing corresponding portions of the first interlevel insulating layer and the first protection layer;
    forming a first wiring layer on the first portion of the semiconductor substrate and the first protection layer;
    forming a second protection layer on the first wiring layer;
    patterning the first and second protection layers and the first wiring layer;
    forming a third protection layer on a side surface of the patterned first wiring layer;
    forming a second interlevel insulating layer over the first interlevel insulating layer, the third protection layer, and the patterned second protection layer;
    exposing a second portion of the semiconductor substrate by removing corresponding portions of the first and second interlevel insulating layers; and
    forming a second wiring layer on the second portion of the semiconductor substrate and the second interlevel insulating layer.

2. The method of claim 1, wherein the first, second and third protection layers are silicon nitride layers.

3. The method of claim 2, wherein the first wiring layer is a bit line.

4. The method of claim 2, wherein the second wiring layer is an electrode of a capacitor.

5. A method of fabricating a semiconductor device comprising:
    forming a gate electrode over a semiconductor substrate;
    forming a first interlevel insulating layer over the semiconductor substrate;
    forming a first protection layer over the first interlevel insulating layer;
    exposing a first portion of the semiconductor substrate by removing corresponding portions of the first interlevel insulating layer and the first protection layer;
    forming a first wiring layer on the first portion of the semiconductor substrate and the first protection layer;
    patterning the first protection layer and the first wiring layer;
    forming a second protection layer on a surface of the patterned first wiring layer;
    forming a second interlevel insulating layer on the first interlevel insulating layer and the second protection layer;
    exposing a second portion of the semiconductor substrate by removing corresponding portions of the first and second interlevel insulating layers; and
    forming a second wiring layer on the second portion of the semiconductor substrate and the second interlevel insulating layer.

6. The method of claim 5, wherein the first and second protection layers are silicon nitride layers.

7. The method of claim 5, wherein the first wiring layer is a bit line.

8. The method of claim 5, wherein the second wiring layer is an electrode of a capacitor.

9. The method of claim 5, wherein the step of forming the second protection layer comprises selectively forming the second protection layer on the surface of the patterned first wiring layer by using an LPCVD.

10. The method of claim 5, wherein said patterning exposes a portion of the first interlevel insulating layer on which the second interlevel insulating layer is formed.

11. A semiconductor device comprising:
    a semiconductor substrate;
    a first conductive line formed on the semiconductor substrate;
    a first interlevel insulating layer formed on the first conductive line and the semiconductor substrate;
    a first protective layer formed on the first interlevel insulating layer;
    a second conductive line formed on the first protective layer;
    a second protective layer formed on a top surface of the second conductive line;
    a third protective layer formed on sidewalls of the second conductive line; and
    a second interlevel insulating layer formed on the second and third protective layers and on the first interlevel insulating layer.

12. The semiconductor device of claim 11, further comprising:
    a contact hole formed through the first and second interlevel insulating layers to the semiconductor substrate; and
    a conductive material formed in the contact hole on the semiconductor substrate and on the second interlevel insulating layer.

13. The semiconductor device of claim 11, wherein the first conductive line is a gate electrode, the second conductive line is a bit line, and the conductive material on the second interlevel insulating layer is a capacitor electrode.

14. The semiconductor device of claim 11, wherein the first, second and third protective layers are silicon nitride.

* * * * *